(12) United States Patent
Chuang et al.

(10) Patent No.: US 6,297,444 B1
(45) Date of Patent: Oct. 2, 2001

(54) FIXING DEVICE

(75) Inventors: Te-Tsai Chuang; Kuo-Cheng Lin; Wen-Shi Huang, all of Taoyuan-Hsien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 09/699,692

(22) Filed: Oct. 30, 2000

(30) Foreign Application Priority Data

Feb. 24, 2000 (TW) .................................................. 89202988

(51) Int. Cl.⁷ ...................................................... H05K 5/00
(52) U.S. Cl. ...................... 174/17 VA; 361/709; 257/706
(58) Field of Search ............... 174/17 VA, 16.1, 174/16.3, DIG. 8, 17 LF, 50; 165/80.2, 80.3, 80.4, 80.5; 257/706; 361/708, 704, 695, 709, 710

(56) References Cited

U.S. PATENT DOCUMENTS

| | | | |
|---|---|---|---|
| 5,548,481 | * | 8/1996 | Salisbury et al. .................... 361/709 |
| 5,953,212 | * | 9/1999 | Lee ........................................ 361/709 |
| 5,973,261 | * | 10/1999 | Chevallet et al. ............... 174/17 VA |
| 6,055,159 | * | 4/2000 | Sun ........................................ 361/704 |
| 6,118,662 | * | 9/2000 | Hutchison et al. ............... 361/710 X |
| 6,143,978 | * | 11/2000 | Ren et al. ......................... 174/17 SF |
| 6,166,327 | * | 12/2000 | Saito et al. ............................. 174/50 |

FOREIGN PATENT DOCUMENTS

406125182 * 5/1994 (JP) .................................. 179/17 VA

* cited by examiner

Primary Examiner—Dean A. Reichard
Assistant Examiner—Dhiru R Patel
(74) Attorney, Agent, or Firm—Keith A. Vogt; Niro, Scavone, Haller & Niro

(57) ABSTRACT

A fixing device disposed on an opening of a guiding tube for fixing a heat sink on the opening is disclosed. The fixing device includes a circular rib and three elastic fixers. The circular rib is set around the opening for depositing the heat sink and sealing seams between the opening and the heat sink when the heat sink is assembled onto the opening. The first elastic fixer is set on the circular rib and has a first inclined plane for fixing the heat sink on the opening by pulsing the first inclined plane against the heat sink along a first direction. The second elastic fixer is set on the circular rib and has an indent for fixing the heat sink on the opening by locking the heat sink in the indent to prevent the heat sink from moving along a second direction. The third elastic fixer is set on the circular rib and has a contact structure for pushing the heat sink along a third direction. The first, second, and third directions are perpendicular to each other.

4 Claims, 4 Drawing Sheets

FIXING DEVICE

FIELD OF THE INVENTION

The present invention is related to a fixing device, and especially to a fixing device having three elastic fixers for fixing a heat sink in X, Y, and Z directions.

BACKGROUND OF THE INVENTION

As the size of an electronic devices are getting smaller and smaller, the heat-generating amount in a unit area of the electronic device is increased seriously. Therefore, how to increase the heat-dissipating efficiency is a very important task.

The heat generated from an electronic device is usually dissipated by using a fan. There are many kinds of fans. Some are disposed on a high-powered electronic device, such as the central processing unit (CPU), and some are disposed on the computer case for increasing the heat convection in the case. Among them, a specific kind of fan is disposed on a gliding tube for gliding the air-current generated from the fan on the electronic device directly to improving the heat-dissipating efficiency.

Conventionally, the fan and the guiding tube are assembled together by screws. As shown in FIG. 1, there are many screw holes 12 on the frame 11 of the fan, and screws 13 are screwed into the holes 12 to assemble the fan on an opening of a guiding tube. Therefore, a screwdriver is an indispensable for assembling or disassembling the fan and guiding tube. Obviously, assembling and disassembling the fan by screws is very time-consuming and seriously increases the production costs.

In addition, assembling the fan and guiding tube by screws will inevitably remain a seam between the fan and tube because they call not be assembled very tight by screws. Therefore, some air will be leaking from the seam to weaken the air-current blown on the electronic device so that the lheat-dissipating efficiency of the fan is lowered.

It is therefore attempted by the present applicant to deal with the above situation encountered with the prior art.

SUMMARY OF THE INVENTION

An object of the present invention is to provide a novel fixing device for depositing a heat sink on an opening of a gliding tube without using any screw so that the heat sink can be assembled or disassembled easily.

Another object of the present invention is to provide a novel fixing device for depositing a heat sink on an opening of a gliding device, wherein there is no seam between the opening and the heat sink to prevent a gas-current from leaking.

The fixing device includes a circular rib set around the opening for depositing the heat sink and sealing seams between the opening and the heat sink when the heat sink is assembled onto the opening, a first elastic fixer set on the circular rib and having a first inclined plane for fixing the heat sink on the opening by pushing the first inclined plane against the heat sink along a first direction, a second elastic fixer set on the circular rib and having an indent for fixing the heat sink on the opening by locking the heat sink in the indent to prevent the heat sink from moving along a second direction, and a third elastic fixer set on the circular rib and having a second inclined plane for fixing the heat sink on the opening by pulsing the second inclined plane against the heat sink along a third direction.

The heat sink preferably is a fan. The first, second, and third directions of the present invention are X, Y, and Z directions and they are perpendicular to each other.

The present invention may best be understood through the following description with reference to the accompanying drawings, in which:

DETAILED DESCRIPTION OF THE PREFERRED EMBODIMENTS

Figure 1:
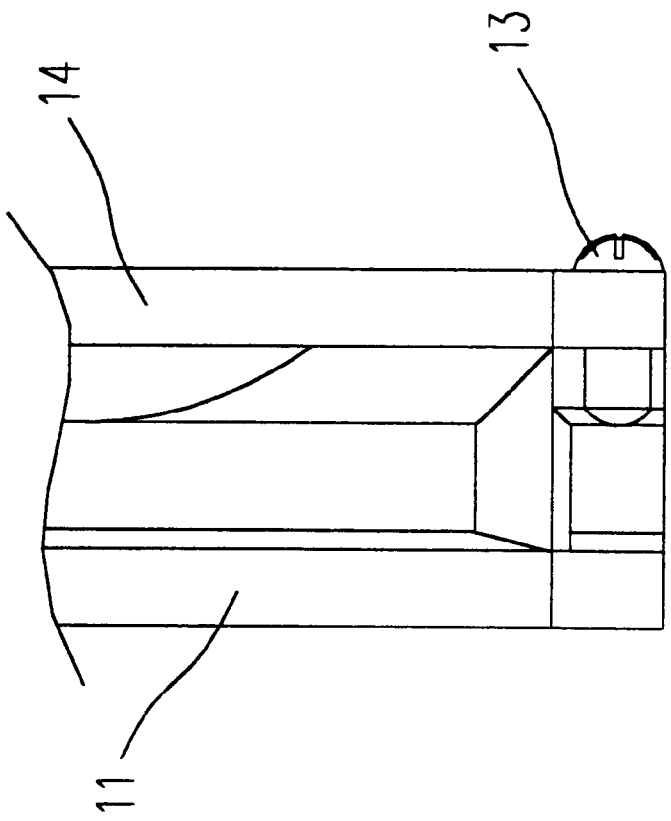
FIG. 1 schematically shows a conventional assembly between a fan and a gliding tube.
Figure 1:
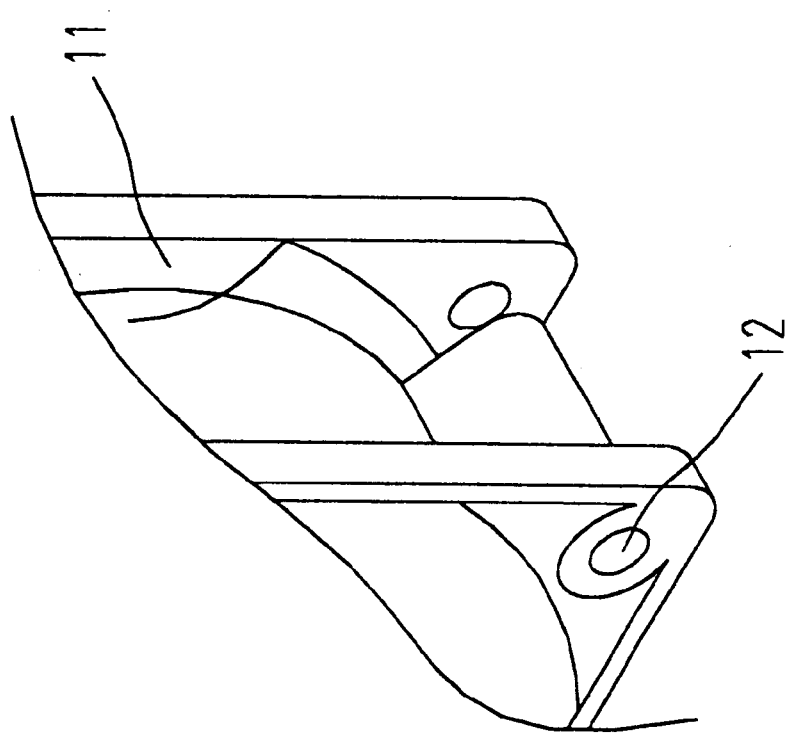
Figure 2:
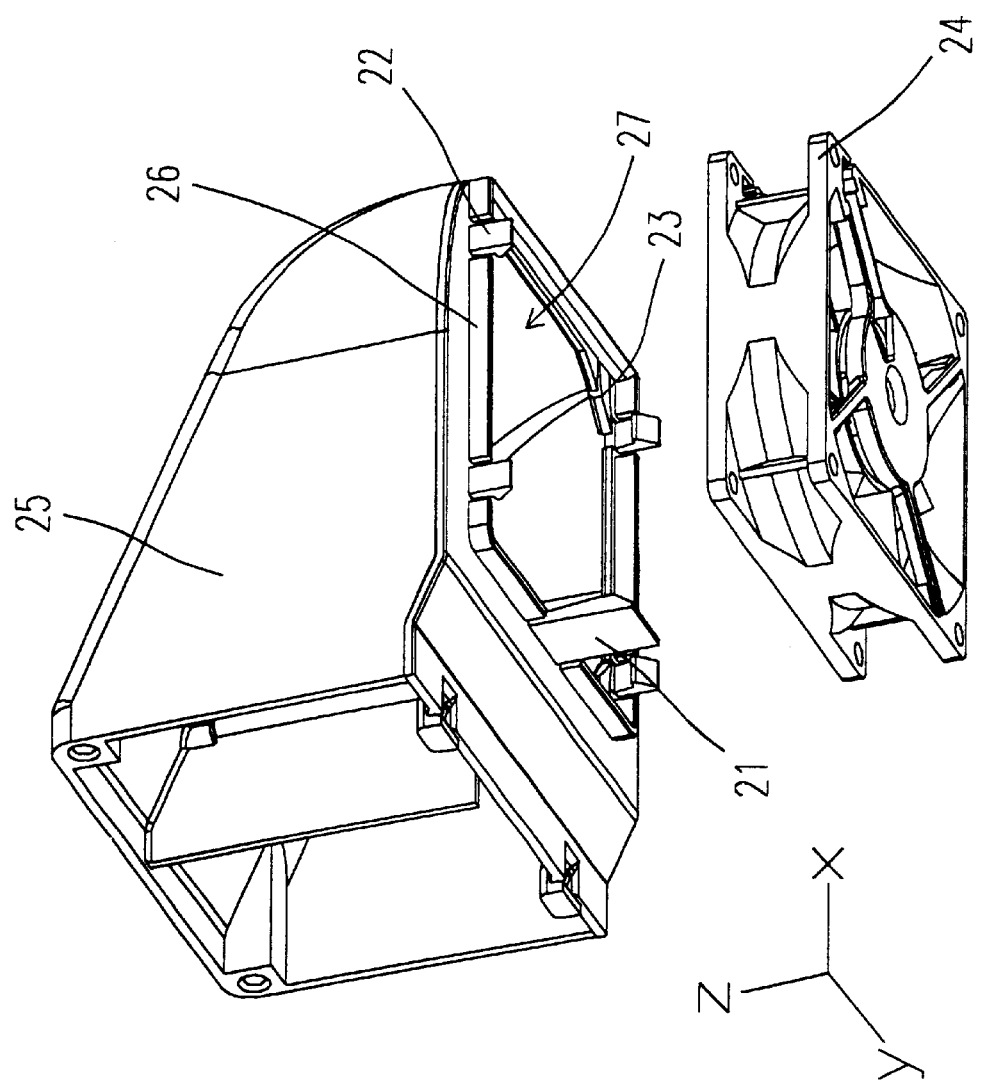
FIG. 2 schematically shows the fixing device of the present invention for a fan and a guiding tube together.

In order to deposit a heat sink on an opening of a guiding tube easily and quickly and seal seams between the heat sink and the guiding tube, the heat sink and guiding tube are assembled together by using a fixing device of the present invention, as shown in FIG. 2. The fixing device is disposed on the opening 27 of the guiding tube 25 including a circular rib 26, a first elastic fixer 21, a second elastic fixer 22, and a third elastic fixer 23. The first elastic fixer 21 is disposed on the left of the fixing device for pushing the frame of the heat sink 24 from the left to allowing the heat sink 24 being against the circular rib 26 on the right so that the heat sink 24 will be no able to move in X direction. The second elastic fixer 22 consists of two pairs of auxiliary fixers for pressing the heat sink 24 from both sides to prevent the heat sink 24 from moving in Y direction. Each of the auxiliary fixers has an indent for locking the frame of the heat sink therein. In addition, in the corner 215 of the base of the fixing device a surface is defined, the third elastic fixer 23 pushes the basal plane of the heat sink 24 out to allow the heat sink 24 to be strongly urged against the first elastic fixer 21 so that the heat sink 24 will be not able to move in Z direction (as shown in FIG. 4).

Figure 3:
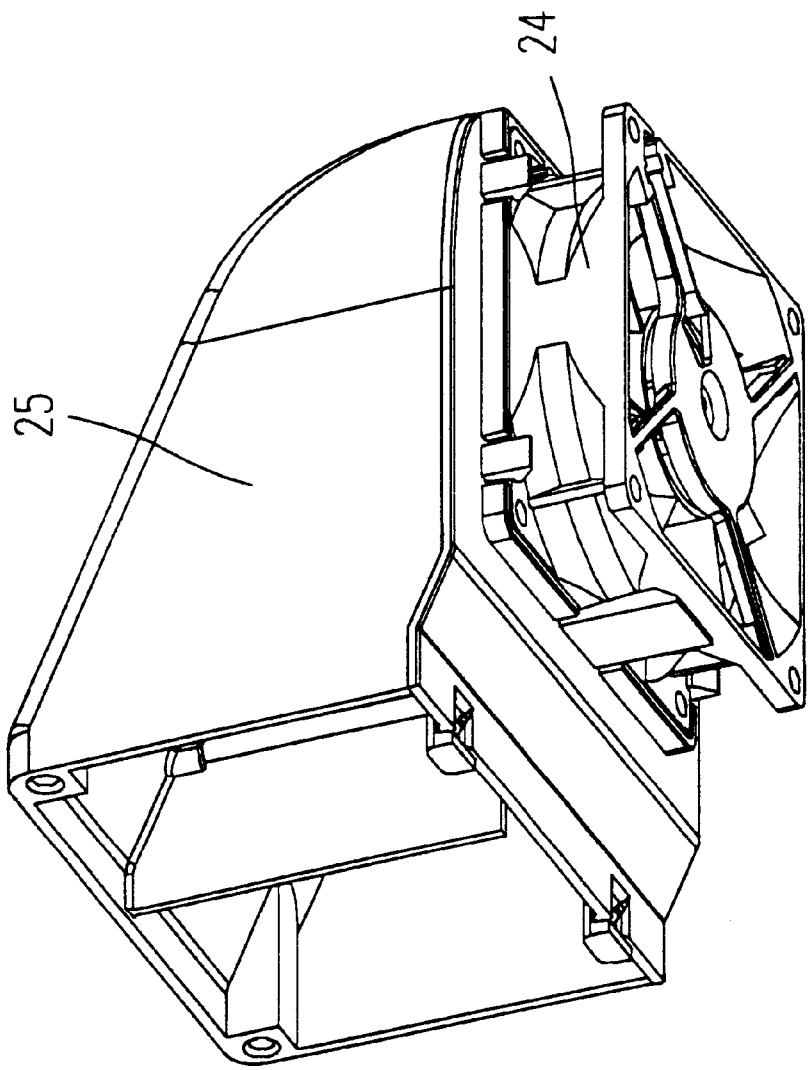
FIG. 3 schematically shows an assembly between a fan and a guiding tube by the fixing device of the present invention.

FIG. 3 is a diagram showing the heat sink 24 and the guiding tube 25 assembled by the fixing device of the present invention. The heat sink 24 is strongly fixed by the first, second, and third elastic fixers and can not move in X, Y, and Z directions. In addition, between the frame of the heat sink and the opening of the guiding tube, there is a circular rib 26 for sealing seams therebetween so that no air-current will be leaking. In FIG. 3, the circular rib is formed outside the frame of the heat sink; however, the circular rib can also be formed inside the frame of the heat sink.

Figure 4:
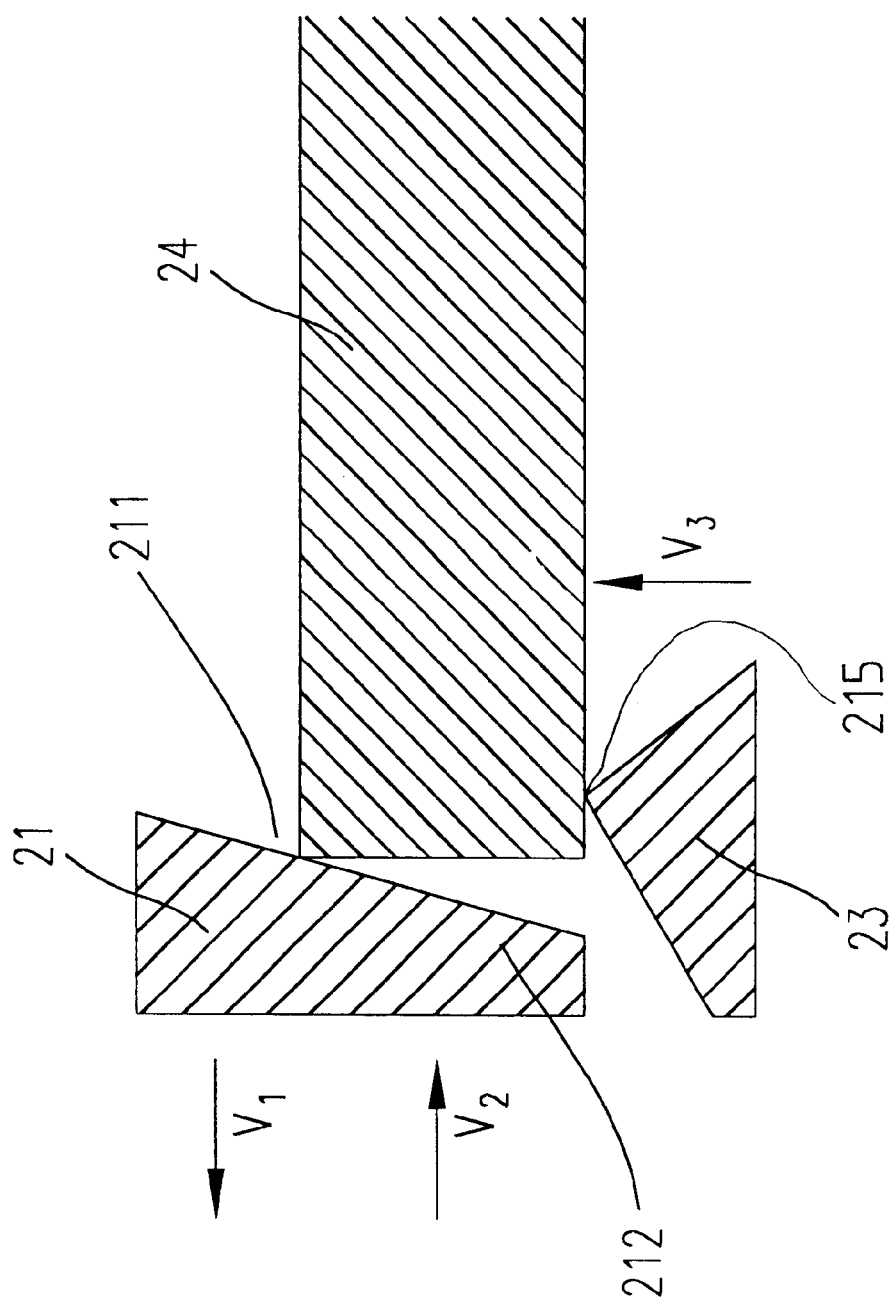
FIG. 4 is a sectional diagram showing how the fan is fixed by a first elastic fixer and a third elastic fixer of the fixing device according to the present invention.

FIG. 4 is a sectional diagram showing how the fan is fixed by the first elastic fixer and the third elastic fixer of the fixing device according to the present invention in detail. The first elastic fixer 21 has a first inclined plane 211 so that even the size of the heat sink 24 is changed, the heat sink 24 can still be fixed strongly. For example, when the frame of the heat sink 24 is larger, the first elastic fixer 21 will expand a little along V1 direction. When the frame of the heat sink( 24 is smaller, the first elastic fixer 21 will draw back a little along direction V2. In addition, the third elastic fixer 23 pushes the heat sink 24 from V3 direction to strongly wedge the heat sink between the first and third elastic fixers.

The heat sink preferably is a fan, and X, Y, and Z directions are perpendicular to each other. The advantages of the present invention are listed as follows:

1. The cost for assembling the components by screws is saved.
2. The time for assembling and disassembling the components is saved.
3. The seams between the heat sink and the guiding tube is sealed and no air-current will be leaking.
4. The fixing device fixed the heat sink strongly. When the heat sink is running, no noise will be introduced.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fixing device disposed on an opening for fixing a heat sink on said opening, comprising:

a circular rib set around said opening for depositing said heat sink and sealing seams between said opening and said heat sink when said heat sink is assembled onto said opening;

a first elastic fixer set on said circular rib and having a first inclined plane for fixing said heat sink on said opening by pushing said first inclined plane against said heat sink along a first direction;

a second elastic fixer set on said circular rib and having an indent for fixing said heat sink on said opening by locking said heat sink in said indent to prevent said heat sink from moving along a second direction; and a third elastic fixer set on said circular rib and having a contact surface for pushing said heat sink along a third direction, wherein said first, second, and third directions are perpendicular to each other.

2. The fixing device according to claim 1, wherein said heat sink is a fan.

3. The fixing device according to claim 1, wherein said first direction is X direction, said second direction is Y direction, and said third directions is Z direction.

4. The fixing device according to claim 2, wherein said opening is disposed at an end of a guiding tube for guiding air fanning from said fan.

* * * * *